United States Patent
Daikoku et al.

(10) Patent No.: US 9,708,734 B2
(45) Date of Patent: Jul. 18, 2017

(54) METHOD FOR PRODUCING A SIC SINGLE CRYSTAL IN THE PRESENCE OF A MAGNETIC FIELD WHICH IS APPLIED TO A SOLUTION

(71) Applicants: Hironori Daikoku, Susono (JP); Hidemitsu Sakamoto, Susono (JP); Motohisa Kado, Gotenba (JP); Kazuhiko Kusunoki, Tokyo (JP)

(72) Inventors: Hironori Daikoku, Susono (JP); Hidemitsu Sakamoto, Susono (JP); Motohisa Kado, Gotenba (JP); Kazuhiko Kusunoki, Tokyo (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 95 days.

(21) Appl. No.: 14/648,027

(22) PCT Filed: Nov. 11, 2013

(86) PCT No.: PCT/JP2013/080427
§ 371 (c)(1),
(2) Date: May 28, 2015

(87) PCT Pub. No.: WO2014/103539
PCT Pub. Date: Jul. 3, 2014

(65) Prior Publication Data
US 2015/0299900 A1  Oct. 22, 2015

(30) Foreign Application Priority Data
Dec. 27, 2012  (JP) .................... 2012-286245

(51) Int. Cl.
*C30B 19/10* (2006.01)
*C30B 30/04* (2006.01)
(Continued)

(52) U.S. Cl.
CPC .............. *C30B 30/04* (2013.01); *C30B 17/00* (2013.01); *C30B 19/04* (2013.01); *C30B 19/062* (2013.01);
(Continued)

(58) Field of Classification Search
CPC .... C30B 9/00; C30B 9/04; C30B 9/06; C30B 9/08; C30B 9/10; C30B 15/00;
(Continued)

(56) References Cited

U.S. PATENT DOCUMENTS 5,911,823 A  6/1999  Sonoda et al.

FOREIGN PATENT DOCUMENTS

JP   H09-165298 A   6/1997
JP   2005-082435 A  3/2005
(Continued)

*Primary Examiner* — Kenneth A Bratland, Jr.
(74) *Attorney, Agent, or Firm* — Oliff PLC

(57) ABSTRACT

The purpose of the present invention is to produce a high-quality SiC single crystal with good reproducibility while avoiding the fluctuations in the solution-contacting position of a seed crystal among production operations. A method for producing a SiC single crystal by bringing a SiC seed crystal supported by a supporting bar into contact with a solution that has been heated by high-frequency induction to thereby grow the SiC single crystal, wherein the supporting bar is born down while applying a magnetic field to the solution to thereby bring the SiC seed crystal into contact with the solution, and subsequently the application of the magnetic field is halted to grow the SiC single crystal.

8 Claims, 4 Drawing Sheets

(51) Int. Cl.
*C30B 29/36* (2006.01)
*C30B 17/00* (2006.01)
*C30B 19/04* (2006.01)
*C30B 19/06* (2006.01)
*C30B 19/12* (2006.01)

(52) U.S. Cl.
CPC .......... C30B 19/067 (2013.01); C30B 19/068 (2013.01); C30B 19/10 (2013.01); C30B 19/12 (2013.01); C30B 29/36 (2013.01)

(58) Field of Classification Search
CPC ....... C30B 15/14; C30B 15/20; C30B 15/203; C30B 17/00; C30B 19/00; C30B 19/02; C30B 19/04; C30B 19/062; C30B 19/08; C30B 19/10; C30B 29/00; C30B 29/10; C30B 29/36
USPC ... 117/11, 13–15, 19, 30, 32, 54–56, 60, 64, 117/73–74, 78–79, 937, 951
See application file for complete search history.

(56) References Cited

FOREIGN PATENT DOCUMENTS

| | | | |
|---|---|---|---|
| JP | 2007-186374 | * | 7/2007 |
| JP | 2007-186374 A | | 7/2007 |
| JP | 2007-223814 A | | 9/2007 |
| JP | 2009-091233 A | | 4/2009 |
| JP | 2009-274887 A | | 11/2009 |
| JP | 2012-193055 | | 10/2012 |
| JP | 2012-240854 A | | 12/2012 |

* cited by examiner

FIG. 4

|  |  | COMPARATIVE EXAMPLE 1 | EXAMPLE 1 |
|---|---|---|---|
|  |  | NO MAGNETIC FIELD AT TIME OF SOLUTION CONTACT | MAGNETIC FIELD AT TIME OF SOLUTION CONTACT (OUTPUT:0.15T) |
| SOLUTION CONTACT POSITION (mm) | AVERAGE | 37.25 | 38.04 |
|  | σ | 1.05 (n = 14) | 0.23 (n = 12) |

FIG. 5

| COMPARATIVE EXAMPLE 1 | EXAMPLE 1 |
|---|---|
| NO MAGNETIC FIELD (SOLUTION CONTACT POSITION) (mm) | MAGNETIC FIELD (SOLUTION CONTACT POSITION) (mm) |
| 37.26 | 37.93 |
| 37.4 | 37.93 |
| 37.78 | 38.04 |
| 37.53 | 38.16 |
| 37.6 | 37.8 |
| 36.8 | 38.1 |
| 38.1 | 38.3 |
| 36.2 | 37.83 |
| 35.9 | 37.89 |
| 38.8 | 38.587 |
| 35.9 | 37.92 |
| 38 | 37.94 |
| 39.4 |  |
| 38.5 |  |
| (n=14) | (n=12) |

|  | COMPARATIVE EXAMPLE 1 | EXAMPLE 1 |
|---|---|---|
|  | NO MAGNETIC FIELD AT TIME OF SOLUTION CONTACT | MAGNETIC FIELD AT TIME OF SOLUTION CONTACT (OUTPUT:0.15T) |
| CRYSTAL ENLARGED ANGLE (°) σ | 26.8 (n = 7) | 2.05 (n = 4) |

10mm

METHOD FOR PRODUCING A SIC SINGLE CRYSTAL IN THE PRESENCE OF A MAGNETIC FIELD WHICH IS APPLIED TO A SOLUTION

TECHNICAL FIELD

The present invention relates to a method of production of an SiC single crystal by the solution method.

BACKGROUND ART

SiC single crystals are thermally and chemically extremely stable, are superior in mechanical strength, and resistant to radiation, in addition, have superior properties such as high breakdown voltage and high thermal conductivity in comparison to Si (silicon) single crystals, enable enable p- and n-conductivity electronic control by adding impurities, and have wide forbidden bandwidths (approximately 3.3 eV for 4H-type single crystal SiC, approximately 3.0 eV for 6H type single crystal SiC). Therefore, realization of high temperature, high frequency, voltage resistance/environment resistance which could not be realized with Si single crystals, GaAs (gallium arsenide) single crystals, and other existing semiconductor materials is possible. Expectations of these as next generation semiconductor materials are rising.

Conventionally, the gas phase method and the solution method are known as typical growth methods of SiC single crystals. As the gas phase method, normally the sublimation method is used. The sublimation method comprises arranging SiC material powder and an SiC single crystal seed crystal facing each other in a graphite crucible and heating the crucible in an inert gas atmosphere to epitaxially grow the single crystal. However, it is known that with this gas phase method, the polycrystals growing from the crucible inner walls negatively affect the quality of the SiC single crystal. Further, the solution method comprises using an SiC single crystal production system which has a basic structure comprised of a crucible for holding a starting solution, a starting solution, a high frequency coil or other external heating system, an insulator material, a seed crystal support member that can be lowered and raised (for example, a graphite rod), and a seed crystal attached to the tip of the seed crystal support member, dissolving C (carbon) from a C supply source, for example, a graphite crucible, into an Si melt, an Si alloy melt in which metal had been dissolved, or another Si-containing melt in the crucible to obtain a starting solution, and growing an SiC single crystal layer on the SiC seed crystal through solution precipitation.

In such a method of growing an SiC single crystal by the solution method, use is made of either the SiC single crystal growth method of the method of growth by providing a temperature gradient to the starting solution so that the solution temperature around the seed crystal becomes lower than the solution temperature at other parts or the method of growth by slowly cooling the entire starting solution.

For example, Japanese Patent Publication No. 2007-186374A describes a method of production of an SiC single crystal which maintains a temperature gradient inside a Si melt in a graphite crucible where the temperature falls from the inside toward the melt surface while growing the SiC single crystal wherein the method applies to the melt in the crucible a vertical magnetic field directed upward from the bottom of the crucible to the melt surface. As a specific example, it shows that by applying a vertical magnetic field directed upward toward the melt surface, it is possible to suppress the natural convection in the Si melt and thereby raise the transport efficiency of C (carbon) from the bottom of the crucible to the seed crystal and raise the speed of growth of the SiC single crystal to about 160 μm/hour.

Further, Japanese Patent Publication No. 2007-223814A discloses a method of production of a single crystal semiconductor which brings a seed crystal to which an impurity has been added into contact with a melt in a crucible and pulls up the seed crystal to thereby produce a single crystal semiconductor, which method of production of a single crystal semiconductor includes a step of applying a magnetic field to the melt, a step of making the seed crystal contact the melt, and a step of pulling up a single crystal semiconductor without necking after the seed crystal contacts the melt. As a specific example, it shows the example of applying a magnetic field to the melt 40 minutes or more before making the seed crystal contact the melt and continuing application of the magnetic field until the silicon single crystal finishes being grown so as to obtain a single crystal silicon semiconductor.

Japanese Patent Publication No. 2009-091233A describes a silicon ingot growth method which includes a step of heating a quartz crucible in which silicon has been charged and applying a 500 Gauss or more magnetic field to the inside of the quartz crucible while making the silicon melt and a step of applying a less than 500 Gauss magnetic field to the inside of the quartz crucible while growing a single crystal silicon ingot from the melted silicon.

Japanese Patent Publication No. 2009-274887A describes a method of growing an SiC single crystal on an SiC seed crystal from an Si—Cr—C solution comprised of a Si—Cr melt into which C has been dissolved wherein the method of production of a single crystal applies a DC magnetic field to the Si—Cr—C solution. As a specific example, it shows an example of using an SiC single crystal growth system which arranges a magnetic field coil at the outside of a high frequency heating coil so as to grow an SiC single crystal under conditions of a growth time of 10 to 20 hours or so and application of a magnetic field whereby a 270 μm/hour or so speed of growth of SiC single crystal is achieved and shows that the direction of the magnetic field is not limited.

Japanese Patent Publication No. 2012-193055A describes a method of production of an SiC single crystal which uses a solution method SiC single crystal production system wherein the method of production of an SiC single crystal uses as at least part of the support part a thermal conducting anisotropic support part which is comprised of a member which has a relationship $TC_H > TC_V$ between a thermal conductivity ($TC_V$) in a direction supporting the crucible and a thermal conductivity ($TC_H$) in a direction vertical to that direction and uses high frequency heating to heat the solution to suppress the formation of polycrystals.

CITATION LIST

Patent Literature

PLT 1: Japanese Patent Publication No. 2007-186374A
PLT 2: Japanese Patent Publication No. 2007-223814A
PLT 3: Japanese Patent Publication No. 2009-091233A
PLT 4: Japanese Patent Publication No. 2009-274887A
PLT 5: Japanese Patent Publication No. 2012-193055A

SUMMARY OF INVENTION

Technical Problem

However, according to these prior art, there is fine vibration at the solution surface due to the high frequency heating which is generally used for heating the solution, so variation occurred in the solution contact position of the seed crystal in different manufacturing batches, so it was difficult to obtain a high quality SiC single crystal with good reproducibility. Therefore, the present invention has as its object to suppress variation in the solution contact position of the seed crystal in different manufacturing batches and obtain a high quality SiC single crystal with a good reproducibility.

Solution to Problem

The present invention relates to a method of production of an SiC single crystal which brings an SiC seed crystal which is supported by a support rod into contact with a high frequency heated solution to grow an SiC single crystal, the method of production of an SiC single crystal making the support rod descend to make the SiC seed crystal contact the solution in the presence of a magnetic field which is applied to the solution, then stopping application of the magnetic field while growing the SiC single crystal.

Advantageous Effects of Invention

According to the present invention, it is possible to suppress variation in the solution contact position of the seed crystal in different manufacturing batches and obtain a high quality SiC single crystal with a good reproducibility.

BRIEF DESCRIPTION OF DRAWINGS

FIG. 4 is a table which shows in comparison the average values and variation of solution contact position after several times of growth of SiC single crystals under the same conditions in examples and comparative examples of the present invention.

FIG. 5 is a table which shows in comparison the measured values of solution contact positions for different manufacturing batches after growth of SiC single crystals in examples and comparative examples of the present invention.

DESCRIPTION OF EMBODIMENTS

In particular, in the present invention, the following embodiments may be mentioned.
1) The method of production wherein the magnetic field is applied for 0.5 minute to 10 minutes until making the SiC seed crystal contact the solution.
2) The method of production wherein the magnetic field stops being applied within 1 minute after the contact.
3) The method of production wherein control to stop application of the magnetic field is performed based on an electric signal which is generated by contact of the solution and SiC seed crystal.
4) The method of production wherein the magnetic field is directed downward from a solution surface toward a bottom part of a crucible.
5) The method of production wherein the magnetic field has a strength of 0.1 T (Tesla, 1 T=$10^4$G (Gauss)) or more.
6) The method of production wherein the SiC single crystal is grown after bring the SiC seed crystal into contact with the solution, then stopping the descent of the support rod while lifting up the support rod.
7) The method of production wherein the starting solution has a temperature of within 1800 to 2100° C. in range.

Figure 1:
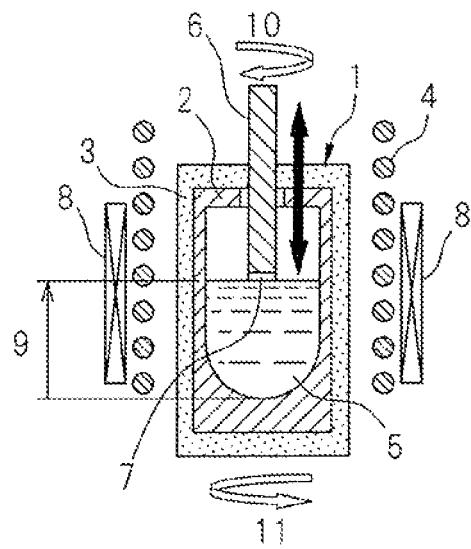
FIG. 1 is a general schematic view of one example of a growth system of an SiC single crystal by the solution method which is used for the method of production of an SiC single crystal of the present invention.

Below, the present invention will be explained in detail referring to the drawings. The method of production of an SiC single crystal by the solution method of an embodiment of the present invention, as shown in FIG. 1, comprises using an SiC single crystal growth system 1 in which an SiC seed crystal 7 which is supported by a graphite support rod 6 is brought into contact with a high frequency heated solution to grow an SiC single crystal during which causing the support rod 6 to descend to make the seed crystal 7 contact the solution 5 in the presence of a magnetic field (not shown) which is applied to the solution 5 by a magnetic field coil 8, then stopping application of the magnetic field to make the SiC single crystal grow. The high frequency heating is performed by a high frequency heating coil 4 which is wound around a graphite crucible 2 via an insulator material 3. Further, in the method of production of the embodiment, the crucible 2 may be rotated in the opposite direction to the rotation direction of the support rod 6 by drive power stored at the bottom part (not shown).

The control method for stopping application of the magnetic field can be performed based on an electrical signal which is produced by contact of the solution 5 and the SiC seed crystal 7 which is supported at the bottom end of the descending support rod 6, for example, the detected current. That is, it is possible to stop or reduce the current which is applied to the magnetic field coil 8 so as to apply the magnetic field based on the electrical signal to thereby stop application of the magnetic field. Further, in the method of production of an SiC single crystal by the solution method of an embodiment of the present invention, the magnetic field is preferably applied for a specific time period predicted in advance until making the SiC seed crystal contact the solution, usually 0.5 minute or more, preferably within 10 minutes, more preferably within 5 minutes, still more preferably within 2 minutes. Further, in the method, after the contact, preferably within 1 minute, more preferably within 30 seconds, the magnetic field stops being applied. Even if the time of application of the magnetic field after contact is longer, the effect does not increase. Conversely, uniform mixing of the solution is obstructed, so this is not preferable. The step of stopping application of the magnetic field can be performed not only by completely stopping application of the magnetic field, but also reducing the strength of the applied magnetic field to less than one-fifth of that at the time of application, for example, less than one-tenth, but is preferably by completely stopping the application of the magnetic field.

The specific time period predicted in advance until causing contact with the SiC seed crystal means the time period which is found by reverse calculation from the distance until the support rod which has stopped in the space above the solution in the crucible of the SiC single crystal growth system descends and the seed crystal reaches the solution surface and the speed of descent. For example, when, from the distance from the stop position of the support rod to the solution surface and the speed of descent of the support rod, 20 minutes are required until the seed crystal contacts the solution, it is more preferable to apply the magnetic field for a certain time until solution contact calculated backward from the time of solution contact, preferably 0.5 minute or more and within 10 minutes, in particular within 5 minutes, especially within 2 minutes.

In this method, the direction of the magnetic field is not particularly limited so long as the magnetic field is vertical (upward or downward magnetic field), but preferably it may be a downward one which heads from the solution surface to the crucible bottom. Further, the magnetic field may preferably be a strength of 0.1 T or more, particularly 0.15 T or more. If the strength of the magnetic field is too small, the effect of application of the magnetic field will decrease, so this is not preferable. While there is no upper limit, if excessively large, this is disadvantageous cost-wise or disadvantageous since unnecessary power consumption is required. Note that the effect due to application of a magnetic field to the solution is that convection inside the liquid metal which has electrical conductivity is suppressed due to the uniform magnetic field and that vibration of the solution surface is suppressed and is generally known (H. A. Chedzey et al., *Nature* 210 (1966) 933).

Figure 2:
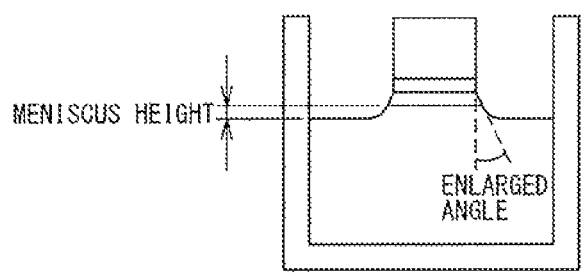
FIG. 2 is a cross-sectional schematic view which shows the state of one example after growth of an SiC single crystal by the solution method.
Figure 3:
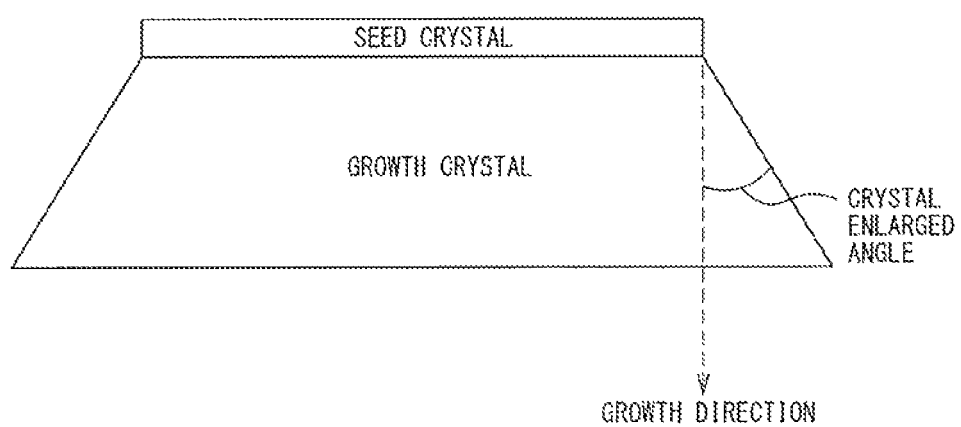
FIG. 3 is a cross-sectional schematic view for explaining an enlarged angle of a grown crystal after growth of an SiC single crystal by the solution method.

In the conventional SiC single crystal growth method, along with high temperature heating of the starting solution, the uniformity of the single crystal surface drops due to the vibration which occurs at the solution surface and/or the unevenness of the temperature distribution, for example, solvent becomes entrained at the grown crystal surface etc. For this reason, a method of growth of a single crystal which can suppress the drop in uniformity due to the entrainment of solvent at the single crystal surface during growth of the single crystal has been sought. Further, when growing an SiC single crystal, as shown in FIG. 2, after growth of the SiC seed crystal, a meniscus of curvature of the solution surface is formed due to the interaction between the surface of the crucible and the solution in the SiC single crystal growth system. This meniscus is formed with an enlarged angle of the grown crystal as shown in FIG. 3 due to the raised height of the SiC seed crystal by pulling up the support rod. According to the prior art, due to the fine vibration of the solution surface caused by the high frequency heating, there is large variation in the solution contact position at the different manufacturing batches. The enlarged angle of the grown crystal was therefore not fixed.

Figures 6, 7A:
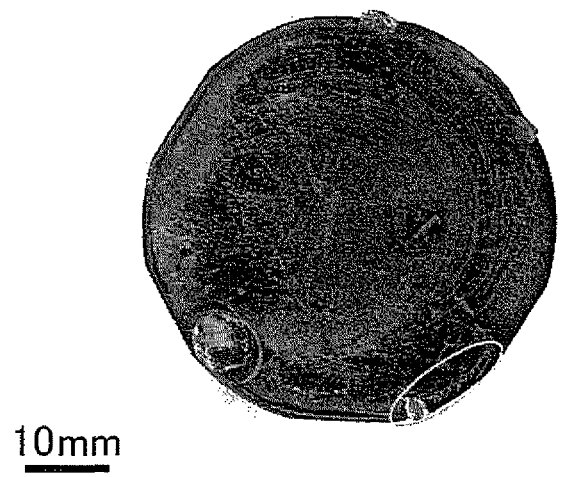
FIG. 6 is a table which shows in comparison the enlarged angle σ (°) of a grown crystal after growth of SiC single crystals in examples and comparative examples of the present invention.
FIG. 7A is a copy of an optical micrograph of an SiC grown single crystal surface of an example.

That is, according to a solution method outside the scope of the present invention which grows an SiC single crystal without applying a magnetic field to the solution, as shown in FIGS. 4 to 6, there is large variation in the solution contact position where the seed crystal and the solution contact and variation in the enlarged angle of the grown crystal. For example, the standard error σ (mm) in the solution contact position is 1 mm or more and the standard error σ (°) in the enlarged angle of the grown crystal is 20° or more.

Figure 7B:
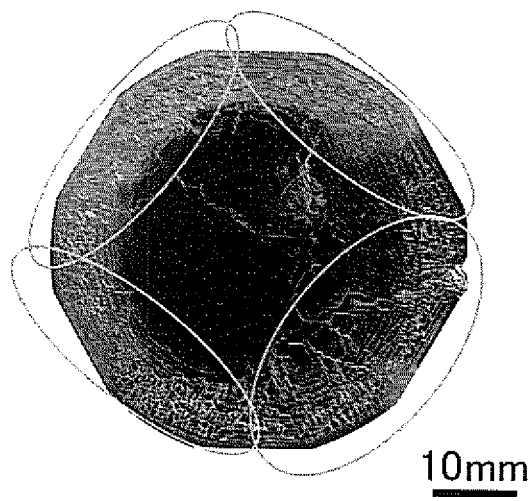
FIG. 7B is a copy of an optical micrograph of an SiC grown single crystal surface of a comparative example.

Further, even if applying a magnetic field to the solution, according to a solution method outside the scope of the present invention, that is, the method of bringing the SiC seed crystal into contact with the solution, then not stopping application of the magnetic field, but continuing to apply the magnetic field while growing the SiC single crystal, as shown in FIG. 7B, the area rate of entrainment of solvent at the single crystal surface is large, for example, 60% or more, so entrainment of solvent at the single crystal surface cannot be suppressed.

As opposed to this, according to the method of the embodiment of the present invention, as shown in FIGS. 4 to 6 and FIG. 7A, there is little variation in the solution contact position where the seed crystal and the solution contact, the enlarged angle of the grown crystal is fixed, and the area rate of entrainment of solvent at the grown crystal surface is small, for example, the σ of the solution contact position is 0.25 mm or less, the σ of the enlarged angle of the grown crystal is 3° or less, in particular 2.5° or less, and the area rate of entrainment of solvent at the grown crystal surface is 10% or less, in particular 7% or less.

In this way, according to the method of the present invention, by stopping the application of the magnetic field after the contact, preferably within 1 minute, more preferably within 30 seconds, while growing the crystal, there was the unexpected result that it was possible to suppress the entrainment of solvent at the single crystal surface. Application of the magnetic field is preferably stopped right after contact so as to reduce the area rate of entrainment of the solvent at the single crystal surface as much as possible. However, stopping application of the magnetic field before contact should be avoided. On the other hand, when performing the control for applying and stopping the magnetic field based on an electrical signal which is produced due to for example contact between the solution and SiC seed crystal, it is practical to stop application in a certain time period after contact, for example, within 1 minute, in particular within 30 seconds.

As the starting solution for growing the SiC single crystal in the present invention, any solution which has Si and C as essential ingredients can be mentioned. For example, from the viewpoint of the quality of the grown crystal, a starting solution which contains the above ingredients plus Ti and/or Cr can be mentioned.

The temperature of the starting solution is, for example, 1800 to 2100° C. in range, in particular 1800 to 2050° C., particularly 1850 to 2050° C. The starting solution can be controlled in temperature by, for example, using high frequency induction heating to heat it, for example, using a radiant thermometer to monitor the temperature of the surface of the starting solution and/or using a thermocouple which is set at the inside of the carbon rod, for example, a W—Re (tungsten/rhenium) thermocouple, to measure the temperature, and using the measured temperature found as the basis for control by a temperature controller.

In the method of production of an SiC single crystal by the solution method of the present invention, the crystal growth conditions, for example, the shape of the graphite crucible, the heating method, the heating time, the speed of descent and ascent of the support rod, the temperature elevation rate, and the cooling rate can be suitably selected to give the optimum conditions from among the conventionally known conditions in the solution method. For example, as the heating time by the high frequency induction heating (approximate time from charging the starting materials to when reaching the SiC saturation concentration), while differing depending on the size of the crucible, 1 to 20 hours or so in range, for example, 5 to 15 hours or so, while as the atmosphere, a rare gas, for example, He, Ne, Ar, or other inert gas or the inert gas and $N_2$ or methane gas in a mixed gas may be mentioned.

According to the method of production of an SiC single crystal by the solution method in the present invention, at a high temperature for a long time, for example, 5 hours or more, there is little variation in the solution contact position where the seed crystal and solution contact, the enlarged angle of the grown crystal is fixed, preferably the σ of the solution contact position is 0.25 mm or less, the σ of the enlarged angle of the crystal growth at the vertical cross-section of the grown crystal is 3° or less, the area rate of entrainment of solvent at the surface of the grown crystal is small, preferably 10% or less, entrainment of solvent at the single crystal surface can be suppressed, and high quality SiC single crystal can be obtained with good reproducibility.

EXAMPLES

Below, examples and comparative examples will be given to explain the present invention more specifically, but the present invention is not limited to the following examples. In the following examples, the SiC single crystal was grown using the SiC single crystal production system which is shown by a general schematic view in FIG. 1 (tank, piping, gas outlet, gas inlet, manometer, and vacuum pump not shown).

In the following examples, the growth of the SiC single crystal was evaluated for the following items by the following measurement methods:

Solution contact position: Distance from crucible bottom detected by current when applying constant voltage to graphite support rod and crucible and when seed crystal contacts solution Crystal enlarged angle: Evaluated by cutting crystal by diamond cutter, photographing vertical cross-section, and visually examining obtained photograph Entrainment of solvent at crystal surface: Evaluated by optical micrograph of crystal surface Example 1

In a graphite crucible, Si, then Cr and Ni were simultaneously added to prepare a solvent: Si-40 at % Cr-5 at % Ni (ratio with respect to Si expressed by at %). A seed crystal of SiC (000-1, C face) was fixed to the tip of a graphite support rod, a high frequency graphite crucible induction heating system was used to maintain a set temperature of 2000° C., when C dissolved from the graphite crucible and the SiC saturation concentration was reached, the graphite support rod was rotated while making it descend, a 0.15 T magnetic field (downward) was applied for 2 minutes, then the seed crystal was made to contact the solution and the solution contact position was measured. Further, 30 seconds after solution contact, the application of the magnetic field was made to stop and the crystal was grown for a growth time period of 5 to 20 hours. Due to this crystal growth, a meniscus was formed as shown in FIG. 2. The above series of steps was performed a total of 12 times and the average value of the solution contact position and the σ (mm) at n=12 were found. Further, the enlarged angle of the grown crystal was measured for four samples and the σ (°) of the enlarged angle at n=4 was found. The results of evaluation are shown together with other results in FIGS. 4 to 6.

Comparative Example 1

Except for not applying a magnetic field, the same procedure was followed as in Example 1 to grow the crystal. Due to this crystal growth, a meniscus was formed as shown in FIG. 2. The above series of steps was performed a total of 14 times and the average value of the solution contact position and the σ (mm) at n=14 were found. Further, the enlarged angle of the grown crystal was measured for seven samples and the σ (°) of the enlarged angle at n=7 was found. The results of evaluation are shown together with other results in FIGS. 4 to 6.

Example 2

Under the same conditions as Example 1, at a set temperature: 2000° C., the graphite support rod was rotated while making it descend. A 20.15 T magnetic field (downward) was applied for 2 minutes, then the seed crystal was made to contact the solution. After 30 seconds after contact, the magnetic field stopped being applied and the crystal was grown for a growth time of 12 hours. A copy of the optical micrograph of the obtained SiC single crystal surface is shown in FIG. 7A. From the photo, the area rate of entrainment of solvent was 6.9%.

Comparative Example 2

Except for not stopping application of the magnetic field even after solution contact, but continuing to apply the magnetic field while growing the crystal, the same procedure was followed as in Example 2 to grow the crystal. A copy of the optical micrograph of the obtained SiC single crystal surface is shown in FIG. 7B. From the photo, the area rate of entrainment of solvent was 64%.

From a comparison of FIGS. 4 to 6 and FIG. 7A and FIG. 7B, in the examples, the σ of the solution contact position was 0.23 mm and the σ of the enlarged angle at the vertical cross-section of the grown crystal was 2.05°, while in Comparative Example 1, the σ of the solution contact position as 1.05 mm and the σ of the enlarged angle was 26.8°. Further, in the examples, the area rate of entrainment of solvent at the grown crystal surface was 6.9%, while in Comparative Example 2, the area rate of entrainment of the solvent was 64%. In this way, it was confirmed that according to the present invention, the variation in solution contact position was small, the enlarged angle was fixed, and entrainment of solvent at the single crystal surface could be remarkably suppressed.

INDUSTRIAL APPLICABILITY

According to the method of the present invention, it becomes possible to suppress variation in SiC single crystal growth in different manufacturing batches and entrainment of solvent at the single crystal surface and thereby produce an SiC single crystal which is promising as a next generation semiconductor material.

REFERENCE SIGNS LIST

1 SiC single crystal growth system used in embodiments of present invention
2 graphite crucible
3 insulator material
4 high frequency heating coil
5 starting solution
6 graphite support rod
7 SiC seed crystal
8 magnetic field coil
9 solution contact position
10 rotation direction of graphite support rod
11 rotation direction of graphite crucible

The invention claimed is:

1. A method of production of a SiC single crystal which brings a SiC seed crystal which is supported by a support rod into contact with a solution that has been heated by induction to grow a SiC single crystal, said method of production of a SiC single crystal making said support rod descend to make the SiC seed crystal contact said solution in the presence of a magnetic field which is applied to said solution, then stopping application of said magnetic field while growing the SiC single crystal.

2. The method of production according to claim 1 wherein said magnetic field is applied for 0.5 minute to 10 minutes until making the SiC seed crystal contact said solution.

3. The method of production according to claim 1 wherein said magnetic field stops being applied within 1 minute after said contact.

4. The method of production according to claim 1 wherein control to stop application of said magnetic field is performed based on an electric signal which is generated by contact of said solution and SiC seed crystal.

5. The method of production according to claim 1 wherein said magnetic field is directed downward from a solution surface toward a bottom part of a crucible.

6. The method of production according to claim 1 wherein said magnetic field has a strength of 0.1 T or more.

7. The method of production according to claim 1 wherein said SiC single crystal is grown after bring the SiC seed crystal into contact with said solution, then stopping the descent of the support rod while lifting up the support rod.

8. The method of production according to claim 1 wherein said solution has a temperature of within 1800 to 2100° C. in range.

* * * * *